United States Patent [19]

Kohashi et al.

[11] 4,086,090

[45] Apr. 25, 1978

[54] FORMATION OF PATTERN USING ACRYLAMIDE-DIACETONEACRYLAMIDE COPOLYMER

[75] Inventors: Takahiro Kohashi; Motoo Akagi; Yoichi Oba, all of Hachioji; Saburo Nonogaki, Tokyo; Makoto Tanaka, Koganei; Tadao Kaneko, Tokyo; Yoshifumi Tomita, Mobara, all of Japan

[73] Assignee: Hitachi, Ltd., Tokyo, Japan

[21] Appl. No.: 615,529

[22] Filed: Sep. 22, 1975

Related U.S. Application Data

[63] Continuation-in-part of Ser. No. 484,321, Jun. 28, 1974, abandoned.

[30] Foreign Application Priority Data

Jul. 25, 1973 Japan .................................. 48-83172

[51] Int. Cl.$^2$ ............................................... G03C 5/00
[52] U.S. Cl. ........................................ 96/35.1; 96/36; 96/36.1; 96/91 N; 96/115 R; 96/115 P; 427/68
[58] Field of Search ................ 96/36, 36.1, 36.2, 75, 96/91 N, 115 R, 115 P, 35.1; 204/159.15, 159.16; 260/349; 427/68

[56] References Cited

U.S. PATENT DOCUMENTS

| 3,278,305 | 10/1966 | Laridon et al. .................... 96/91 N |
|---|---|---|
| 3,475,176 | 10/1969 | Rauner ............................... 96/91 N |
| 3,558,310 | 1/1971 | Mayaud .............................. 96/36.1 |
| 3,616,370 | 10/1971 | Jennings ........................ 204/159.15 |
| 3,715,210 | 2/1963 | Watkinson et al. ................ 96/91 N |
| 3,721,566 | 3/1973 | Laridon et al. .................... 96/91 N |
| 3,788,846 | 1/1974 | Mayaud et al. .................... 96/36.1 |
| 3,884,703 | 5/1975 | Oba et al. ...................... 96/36.1 X |

*Primary Examiner*—Edward C. Kimlin
*Attorney, Agent, or Firm*—Craig and Antonelli

[57] ABSTRACT

The present invention affords a process for forming a pattern having a surface area substantially equal to or smaller than area of apertures of shadow-mask through which beams pass on a photoresist film, which contains an acrylamidediacetoneacrylamide copolymer and a water-soluble aromatic bisazide compound, by exposing said photoresist film to light through a mask having the pattern and then developing the film.

The use of said photoresist film for the preparation of a phosphor screen of a color picture tube of a black matrix or black stripe type does not require a special technique such as post-etching of a shadow mask and makes it possible to form a three primary color phosphor pattern having a surface area substantially equal to or smaller than the area of apertures of the shadow mask through which lightbeams pass, without mutual "bridging" between phosphor dots. Thus, an excellent phosphor screen of a color picture tube of a black matrix or black stripe type can be prepared.

25 Claims, 10 Drawing Figures

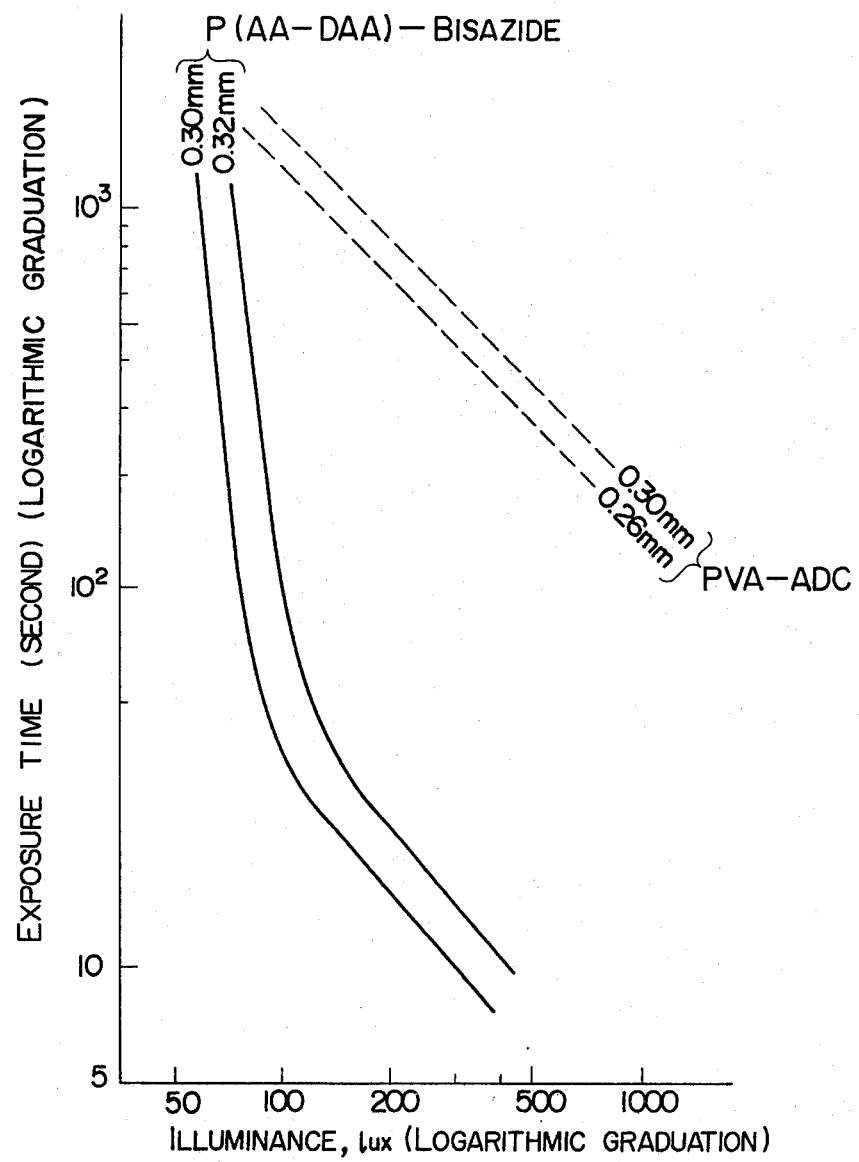

FORMATION OF PATTERN USING ACRYLAMIDE-DIACETONEACRYLAMIDE COPOLYMER

This is a continuation-in-part of U.S. patent application Ser. No. 484,321 filed on June 28, 1974, now abandoned.

The present invention relates to a process for forming a pattern, more particularly a pattern on a phosphor screen of a color picture tube.

In prior color picture tubes of a shadow mask type, three primary color phosphors, i.e., red (R), green (G) and blue (B) phosphors have been formed in the form of round dots on the inner surface of a face plate and these phosphors have been made to emit light by scanning them with an electron beam having a slightly smaller area than that of the phosphor dots.

In such prior color picture tubes, glass having a poor light transparency has been used as a face glass of the tubes for the purpose of preventing external light from being reflected by the phosphor screen. Therefore, the brightness of images is lowered and the contrast of images is lacked.

For the purpose of eliminating such defects as mentioned above, there was proposed a color picture tube of a so-called black matrix type, in which the size of each phosphor dot is smaller than that of the scanning beam and a space between phosphor dots is filled with a non-luminescent and light-absorbing substance such as carbon.

A color picture tube of a black matrix type has an improved contrast of images and an improved color purity, because in this tube three electron beams do not collide dots other than respective target dots. Further, such tube can employ a face glass having so high transparency that the brightness of images is about two times higher than that of prior tubes, because a non-luminescent and light-absorbing substance present between phosphor dots absorbs external light. Thus, the color picture tube of a black matrix type has some advantages as mentioned above.

On the other hand, a color picture tube of a shadow mask type has low color reproducibility, because the deviation in sites of phosphor dots and openings through which electron beams pass from each other makes it impossible that the electron beams collide their target dots.

For the above reasons, a shadow mask used for forming phosphor dots must be the same as a shadow mask built in a resulting tube. Particularly, in the case of a tube of a black matrix type, phosphor dots having smaller diameters than those of the corresponding electron beams (i.e., the diameters of aperture of a shadow mask through which electron beams pass) must be formed on the inner surface of a face plate by using only one shadow mask. For this purpose, a process called the post-etching process has been proposed.

This process comprises the steps: firstly forming a phosphor screen by using a shadow mask having smaller aperture (on which screen a space between phosphor dots is filled with non-luminescent and light-absorbing substance such as carbon) and secondly etching the shadow mask used for the light-exposure with an appropriate acid to make the aperture larger, the shadow mask thus obtained being built in the color picture tube.

Although this process achieves said purpose, the second etching of the shadow mask with an acid produces such disadvantages that the condition of side walls of the aperture is deteriorated by the side etch, the oxide film adhered to the surface of the shadow mask for the thermal emission is eliminated by the acid and strain is introduced into the shadow mask by the heat treatment after the second etching.

As another prior process, there is an optical process not using the post-etching technique. This process employs a special light source such as a circular light source or a rotary light source for each color, i.e., R, G or B for the purpose of forming phosphor dots. Thus, this process is superior to the process mentioned hereinbefore, on the point that the shadow mask is not necessary to etch after forming a phosphor screen in this process. However, there is a problem that this process needs the special light source and the performance of a tube varies depending upon the nature of a photoresist used.

That is to say, the prior process using a polyvinyl alcohol (PVA)-ammonium dichromate (ADC) photoresist which is generally used cannot avoid the overlapping of the three primary color lights which are used for the formation of phosphor dots, even by the special light source as mentioned above, when the desired brightness and high landing allowance (which does not cause the luminescence of phosphor dots to lack even when the deviation of the positions of the dots from the positions to be irradiated by electron beams occurs) are to be obtained. Therefore, one dot is connected with adjacent dots which must be essentially separated from the dot, that is, the phenomenon of the so-called "bridging" unfavorably tends to occur. Thus, only smaller phosphor dots can be formed.

The object of the present invention is to solve the above-mentioned problems which prior processes for manufacturing a color picture tube of a black matrix type or black stripe type have encountered and to provide a process for forming a phosphor pattern having an area substantially equal to or smaller than that of apertures of a shadow mask through which beams pass without the post-etching step.

The "phosphor pattern" herein used may include a stripe pattern as well as a pattern of rectangular dots, square dots or polygonal dots in addition to a pattern of round dots.

The process of the present invention is characterized by using a material containing an acrylamide-diacetoneacrylamide copolymer and a water-soluble aromatic bisazide compound as a photoresist having the reciprocity law failure property and the light exposure is effected under such condition that a value of Schwarzschild's constant p satisfies the relation of $0 < p < 0.76$, whereby the development of cross-linking of the photoresist in a portion thereof exposed to an amount of a light below a certain amount is inhibited and phosphor dots for each of the three primary colors, R, G and B, which dots are equal to or smaller than openings for the passage of beams of a shadow mask, are precisely formed without the "bridging" between the dots.

FIG. 4 is a graph showing a relationship between the illuminance and the exposure time required to form a predetermined dot pattern on a prior photoresist film and the photoresist film according to the present invention.

An example of the process for manufacturing a phosphor screen of a color picture tube of a black matrix type comprises the following steps:

1. a photoresist which shows the reciprocity law failure characteristic under ordinary exposing conditions is coated on the inner surface of a face plate and dried;

2. a shadow mask is mounted and light is applied through apertures for the passage of beams of the shadow mask to positions on which the three primary color phosphor dots are to be formed, whereby photoresist film of the portion to which light is applied is insolubilized. This insolubilized portion is substantially equal to or smaller than the area of the beam passing apertures.

3. the shadow mask is removed and the development is made with water, thereby photochemically hardened dots of the photoresist being left. Thus, hardened dot of photoresist which is substantially equal to or smaller than the area of beam-passing apertures of shadow mask is formed.

4. a colloidal black carbon suspension is coated on the inner surface of the face plate and dried;

5. a chemically digesting agent is poured onto said inner surface of the face plate to eliminate the hardened dots of the photoresist together with the carbon adhered to said dots, thereby matrix holes being formed in the black carbon film.

6. slurries for three primary color phosphors are successively coated, exposed and developed, thereby the matrix holes being filled with the three primary color phosphors in the predetermined pattern; and thereafter 7. aluminizing, frit-baking, and mounting of an electron gun are effected in a conventional manner.

Figure 1A:
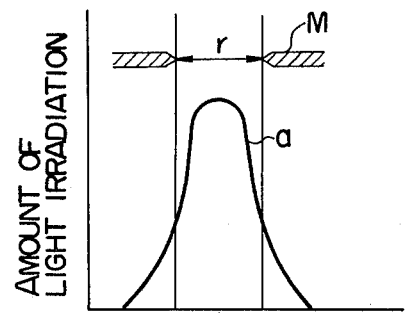
FIG. 1A is a diagram showing the amount of light received by a photoresist film which was exposed to the light passing through a shadow mask M having apertures for the passage of beams, the diameter of the openings being represented by "r".

In FIG. 1A, the amount of light received by the photoresist film when exposed to ultraviolet ray through an opening for the passage of beam of a shadow mask M having a diameter of r in step (2) above is referred to as "a". The amount "a" of light received is the maximum at the center of the aperture and decreased as a distance from the center is greater.

However, the photoresist film does not receive light at only an area thereon corresponding to that of the aperture for the passage of beam, but it receives some amounts of light at the periphery of said area.

Figure 1B:
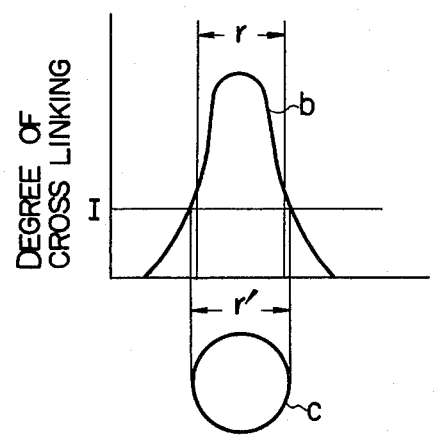
FIG. 1B is a diagram showing the degree of cross-linking of a prior photoresist film by the amount of light shown in FIG. 1A.

For the above reason, the cross-linking reaction proceeds to the peripheral area, as shown with b in FIG. 1B, when a prior photoresist is exposed to light. For a prior photoresist generally used, for example, polyvinyl alcohol, ammonium dichromate, the degree of cross-linking produced by light is in proportion to the amount of light received by the photoresist and, therefore, profile b of the degree of cross-linking is almost the same as profile a of the amount of light.

Thus, the size of the dot thus obtained is shown with a circle c having a diameter of r', which is greater than the aperture for the passage of beam (diameter: r), if the minimum degree of cross-linking required to form the dot is I.

On the other hand, the photoresist used in the present invention, which has the reciprocity law failure property, exhibits a function or behavior entirely different from the prior photoresist.

Figure 1C:
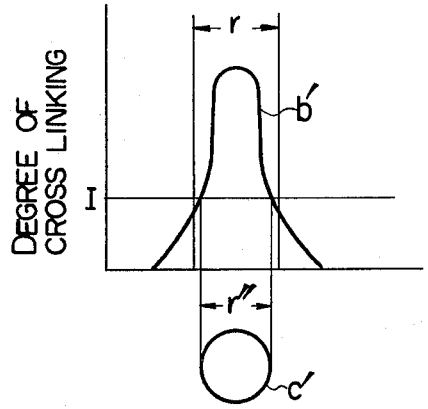
FIG. 1C is a diagram showing the degree of cross-linking of the photoresist film according to the present invention by the amount of light shown in FIG. 1A.

That is, a photoresist exhibiting the reciprocity law failure property has cross-linking effects not in proportion to the amount of light applied, and the cross-linking reaction is very poor when the amount of light applied is below a certain amount. Therefore, profile b' of the degree of cross-linking is entirely different from profile a of the amount of light, as shown in FIG. 1C.

Profile b' of the degree of cross-linking of a photoresist exhibiting the reciprocity law failure property has a sharp slope in the vicinity of the center of the aperture for the passage of beam, and the degree of cross-linking is markedly decreased as the distance from the center is greater.

Therefore, the degree of cross-linking in the margin of the aperture for the passage of beam does not achieve the minimum degree I required to form dots and the diameter r" of the resulting dot c' is smaller than the diameter r of the aperture for the passage of beam.

A photoresist exhibiting the reciprocity law failure property has not been preferred and not used for the formation of the pattern. The present invention breaks down such common knowledge and makes a reverse use of such reciprocity law failure property, thereby the formation of phosphor dots equal to or smaller in size than aperture for the passage of beams of a shadow mask being possible without any special technique such as the post-etching technique.

Next, it will be explained that the use of photoresist exhibiting the reciprocity law failure property inhibits phosphor dots from connecting with each other.

Figure 2A:
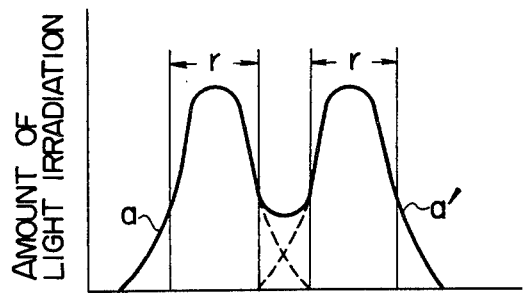
FIG. 2A is a diagram showing the amount of light received by a photoresist film which was exposed to the light passing through two aperture for the passage of beams, which apertures are close to each other.

Profiles a and a' in FIG. 2A show amounts of light received by a prior photoresist on two places at which two adjacent phosphor dots are formed, when the photoresist is three times exposed to light through apertures for the passage of beams (diameter: r) of a shadow mask to form three primary color phosphor dots.

Profiles a and a' are the same as respective single profiles (see a of FIG. 1A) at an area at which both the profiles do not overlap each other, but the amount of light received by a photoresist layer at an area at which both the profiles overlap each other is represented as the sum of the amounts shown with both the profiles a and a'.

Figure 2B:
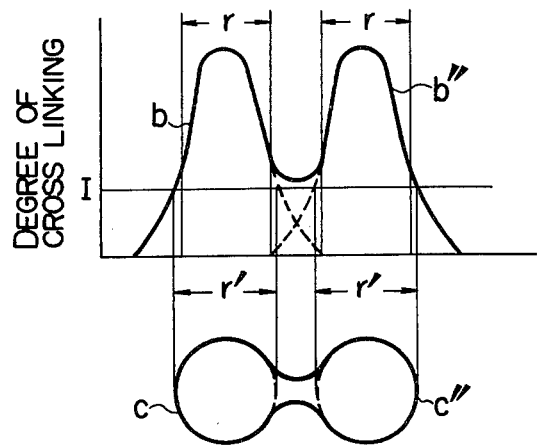
FIG. 2B is a diagram showing the degree of cross-linking of a prior photoresist film by the amount of light shown in FIG. 2A.

Therefore, the degree of cross-linking of the prior photoresist is represented as the sum of both the degrees shown with profiles $b$ and $b''$ in FIG. 2B at an area at which both the profiles overlap each other.

If said sum is above I, two adjacent dots $c$ and $c''$ connect with each other. Thus, the "bridging" occurs.

Figure 2C:
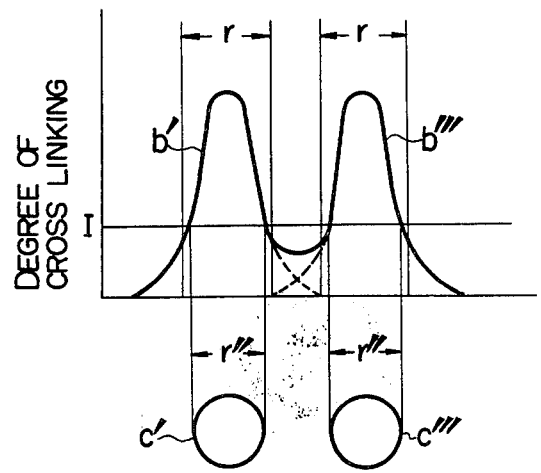
FIG. 2C is a diagram showing the degree of cross-linking of the photoresist film according to the present invention by the amount of light shown in FIG. 2A.

To the contrary, the degree of cross-linking is so poor at the margin of each dot obtained by using a photoresist exhibiting the reciprocity law failure property that the sum of the degree of cross-linking at an area at which both profiles $b'$ and $b'''$ overlap each other as shown in FIG. 2C does not reach I. Therefore, two adjacent dots $c'$ and $c'''$ are independently formed without connecting with each other.

The brightness of a phosphor screen of a color picture tube is clearly determined by the size of phosphor dots, if the diameter of electron beams (which is determined by the diameter of apertures for the passage of beams of a shadow mask) is constant. Therefore, from the standpoint of brightness only the size of each phosphor dot is desired to be smaller than the diameter of openings for the passage of beams of a shadow mask but as large as possible.

However, for a color picture tube of a black matrix type it has been stated above that the "bridging" between phosphor dots occurs due to the overlapping effect, so that larger dots are obtained and prevent the brightness from increasing.

Figure 3A:
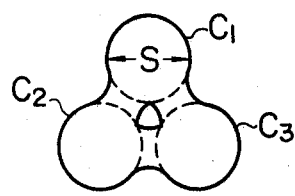
FIGS. 3A and 3B illustrate the shape of phosphor dots prepared by using a prior photoresist film.
Figure 3B:
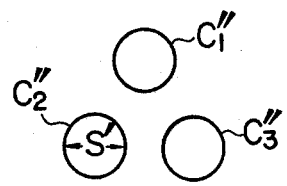
Figure 3C:
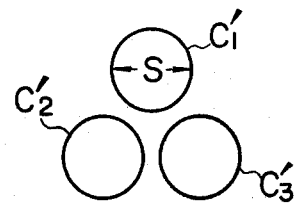
FIG. 3C illustrates the shape of phosphor dots prepared by using the photoresist film according to the present invention.

As shown in FIG. 3A, the increase in diameter $s$ of three primary color, R, G and B dots $c_1$, $c_2$ and $c_3$ for the purpose of obtaining a high landing allowance leads to the mutual bridging of these dots when a prior photoresist is used. Dots $c_1''$, $c_2''$, $c_3''$ having smaller diameter $s'$ could only be formed to avoid the "bridging" as shown in FIG. 3B. According to the present invention, it has been found that the use of the photoresist exhibiting the reciprocity law failure property makes it possible to form three primary color phosphor dots $c_1'$, $c_2'$ and $c_3'$ as shown in FIG. 3C without making the diameter $s$ of these dots smaller and producing the "bridging" between these dots.

According to the present invention, there can be obtained a color picture tube which is brighter than that obtained by the prior optical process, because the present invention allows dots to be larger within the size range which is acceptable in practical operations.

Next, conditions under which dots are formed without producing the "bridging" between these dots by using a photoresist exhibiting the reciprocity law failure property will be detailedly explained.

When the intensity of light applied to a photoresist is $i$, the exposure time $t$ and the resulting degree of cross-linking B, the following relationship is made for a prior photoresist, as shown with $b$ in FIG. 1B:

$$B = f(i \cdot t) \qquad (1)$$

On the other hand, the following relationship is made for a photoresist exhibiting the reciprocity law failure property, as shown with $b'$ in FIG. 1C:

$$B = f(i \cdot tp) \qquad (2)$$

where $p$ is a Schwartzschild's constant and it is more than 0 and less than 1.

There are no concrete expressions of functions $f$ for relationships (1) and (2), but the following equations (1') and (2') can be employed in place of relationship (1) and (2), respectively:

$$B = ki \cdot t \qquad (1')$$

$$B = k'i^{1/p} \cdot t \qquad (2')$$

wherein $k$ and $k'$ are proportional coefficient and the Schwartzschild's constant $p$ is greater than 0 and smaller than 1, because it may be considered that for both prior photoresists such as polyvinyl alcohol, ammonium dichromate and the photoresist used in the present invention the cross-linking effect is in proportion to the exposure time within the practical range of the total amount of light received by each of these photoresist. When $p$ equals to 1, the reciprocity law is established, where (2') means the same as (1').

Practically, with decrease in a value of $p$ from 1, it becomes easier to form dots of the desired size without producing the "bridging" between these dots.

A value of $p$ effective to the practice of the present invention is determined in the following manner.

Profiles of the amounts of light applied to a photoresist through aperture for the passage of beams of a shadow mask M are shown with $a$ and $a'$ in FIG. 2A. Usually, the sum of the amounts of light as shown with $a$ and $a'$ at an area at which they overlap each other attains about 80% of the amounts of light at the centers of $a$ and $a'$.

Since the degree of cross-linking at an area between two dots similarly attains about 80% of that at the centers of the dots, the amount of light applied must be adjusted so that the minimum degree of cross-linking I required to form dots without producing the "bridging" between these dots falls within a very narrow range of 80 to 100% of the amount of light received by the photoresist. If such condition is not satisfied, the degree of the cross-linking at an area between two dots is about I and the production of the "bridging" between these dots cannot be avoided.

If the amount of light applied cannot be restricted to so narrow range, the degree of cross-linking at an area between the dots can be less than I only by keeping the pitch of apertures for the passage of beams of a shadow mask M as it is and making the diameter of dots smaller.

The diameter $r'$ of dots $c$ and $c''$ thus obtained is naturally smaller and such dots have a great lack of brightness.

As mentioned above, for a prior photoresist, a degree of cross-linking is 80% by overlapping at an area between two adjacent dots, 40% of which is contributed to by the amount of light required to form one dot. On the other hand, for the photoresist used in the present invention, a degree of cross-linking at an area between two adjacent dots is much smaller than that at the center of each dot due to the reciprocity law failure property as shown by relationship (2'), even when light exposure is made under the same conditions. Therefore, it is very easy to obtain dots having a desired size without producing the "bridging" between the dots, because when a photoresist having the reciprocity law failure property is used the amount of light applied can be adjusted to from 60% to 100% to form dots without producing the "bridging" between the dots, if a degree of cross-linking at an area between the dots is 60%, whereas, when a prior photoresist is used, the amount of light applied is adjusted to from 80% to 100%, as mentioned above and thus the adjustable range of the amount of light applied to a photoresist having the reciprocity law failure property is two times broader than that to a prior photoresist.

This degree of cross-linking of 60% is composed of 30% for each of two adjacent dots at an area between the dots.

If a degree of cross-linking at a center between two adjacent dots can be limited to 60% or less, good dots can be easily formed without producing the "bridging" between the dots.

In order to limit a degree of cross-linking to 60% or less, the Schwartzschild's constant $p$ in relationship (2') is determined as follows.

When the intensity of light applied to the center of a dot and the degree of cross-linking at said center are $i_o$ and $B_o$, respectively, and the intensity of light applied to the middle point between two adjacent dots and the degree of cross-linking at said middle point are $i_1$ and $B_1$, the following relationship are established:

$$B_o = k' i_o^{1/p} \cdot t \quad (3)$$

$$B_1 = k' i_1^{1/p} \cdot t \quad (4)$$

That is, the following is derived from (3) and (4) above:

$$B_1/B_o = (i_1/i_o)^{1/p} \quad (5)$$

$B_1 = 0.3 B_o$ and $i_1 = 0.4 i_o$ are introduced into (5) above. That is, $$0.3 = (0.4)^{1/p} \quad (6)$$

Accordingly, $$p = 0.76 \quad (7)$$

Therefore, in order to obtain good dots by using a photoresist having the reciprocity law failure property, Schwartzschild's constant $p$ should be less than 0.76. This can be expressed by $$0 < p < 0.76 \quad (8)$$

Another great advantage of the photoresist used in the present invention is that the development of cross-linking is a dark reaction after light exposure is very poor.

For a prior photoresist such as polyvinyl alcohol-ammonium dichromate, the cross-linking in dark reaction after light exposure is markedly developed, so that cross-linked areas are increased and the size of the resulting dots becomes irregular. Thus, dots having the same size were difficult to obtain in a prior photoresist.

However, there is little dark reaction after light exposure in the photoresist used in the present invention and, therefore, dots having the same size can be easily obtained.

In a prior photoresist the development of cross-linking in dark reaction after light exposure could not be inhibited. The size of phosphor dots was made uniform and non-uniformity in white color was inhibited by controlling an effective amount of irradiating light and further a waiting time for the development. And this waiting time could not be extended beyond a limit, because too long waiting time causes the increase of cross-linked area and the "bridging" between dots.

To the contrary, in the photoresist used in the present invention there is no increase of cross-linked area by the dark reaction and, therefore, phosphor dots having the same size can be obtained only by controlling an effective amount of irradiating light and, in other words, the waiting time for the development is not necessary to control.

A photoresist having the reciprocity law failure property includes at least one of polymers containing polyvinyl pyrrolidone or vinyl pyrrolidone, and water-soluble bisazide compounds, but the photoresist used in the present invention is far higher in a photosensitivity of the degree of cross-linking than the above-mentioned substances under condition of $0 < p < 0.76$. Therefore, the present invention can provide an improved process for forming a desired pattern by applying light having lower illumination.

The photoresist used in the present invention comprises a composition containing an acrylamide-diacetoneacrylamide copolymer and a water-soluble aromatic bisazide compound.

The copolymerization ratio of acrylamide (AA) and diacetoneacrylamide (DAA) (i.e., AA/DAA) is preferably in the range of 1.5/1 - 3.0/1 on a mole basis of monomers.

If said ratio is lower than said range the copolymer is hardly soluble in water. If said ratio is higher than said ratio, the reciprocity law failure property is decreased.

The ratio of said copolymer and said bisazide compound is preferably in the range of 0.02 - 0.50 parts by weight of the bisazide compound per 1 part by weight of the copolymer.

If the amount of the bisazide compound is smaller than said range the cross-linking reaction does not satisfactorily proceed. If said amount is greater than said range, the properties of hardened photoresist layer are poor.

In general, there are ordinary exposing conditions suitable for mass production of color picture tube, namely, the conditions specified by exposing time and illuminance of light irradiated on the photoresist film.

When the exposing time is too long, mass production of color picture tube is difficult and when too short, it is difficult to exactly adjust the exposure amount. Optimum value of the exposing time is chosen depending upon intensity of light source, shadow mask, kind of color picture tube to be produced and this value is 5–500 sec for each of R, G and B dots.

Optimum value of illuminance of light irradiated on photoresist is chosen depending upon kind of photoresist used, shadow mask, kind of color picture tube and kind of light source and the optimum range is 50–10,000 luxes at near the center of the dots formed after development.

The photoresist of the present invention shows the reciprocity law failure characteristic under said range of the ordinary exposing conditions by suitably combining its composition, namely, copolymerization ratio in the copolymer and amount of bisazide added within said ranges.

Further, an adhesion promotor may be added to said photoresist to improve the adhesion between the photoresist layer and the face glass and the shape of the resulting matrix holes. Furthermore, ethylene glycol and/or a surface-active agent may be added to said photoresist to remove unevenness of a photoresist coating.

Furthermore, one or more of water-soluble high molecular materials which are compatible with the acrylamide-diacetoacrylamide copolymer may be incorporated into the composition.

As the water-soluble high molecular materials which can be incorporated, there are used homopolymers such as carboxymethylcellulose, hydroxymethylcellulose, a sodium salt of poly-L-glutamic acid, gelatine, polyacrylamide, polyvinyl methylether, polyvinyl alcohol, polyvinyl acetal and polyethylene oxide, or copolymers such as an acrylamide-vinyl alcohol copolymer and a maleic acid-vinyl methylether copolymer.

As the bisazide compounds, water-soluble aromatic bisazide compounds such as 4,4'-diazidobenzalacetophenone-2-sulfonic acid, 4,4'-diazidostilbene-2,2'-disulfonic acid and their sulfonates and 4,4'-diazidostilbene-γ-carboxylic acid and its carboxylate can be used.

As said sulfonate or carboxylate, salts of alkali metals such as sodium, potassium, etc., alkaline earth metals such as magnesium, calcium, aluminum, etc. or ammonium may be used. Those which are preferred among these compounds are said sulfonic acids and their sulfonates and among the sulfonates, salts of sodium, potassium and ammonium are particularly preferred because they have high solubility.

As the adhesion promotor, there are used water-soluble functional alkoxysilanes such as vinyl tris(β-methoxyethoxy)silane, N-β(aminoethyl)-aminopropylmethyldimethoxysilane and N-β(aminoethyl)γ-aminopropyltrimethoxysilane.

As the surface-active agents, there are used polyoxyethylenealkylethers such as polyoxyethylenelaurylether, polyoxyethylenecetylether, polyoxyethylenestearylether and polyoxyethyleneoctylether, and polyoxyethylenealkylphenolethers such as polyoxyethyleneoctylphenolether and polyoxyethylenenonylphenolether. Further, a compound such as sorbitan fatty acid esters, polyoxyethylene sorbitan fatty acid esters, polyoxyethyleneacyl esters or fatty acid monoglycerides may be used.

When a phosphor screen is practically prepared using the thus-obtained photoresist, a stripping agent is required to remove a hardened photoresist layer. As the stripping agent, an oxidizing agent, for example, hypochlorites such as hypochlorous acid and sodium hypochlorite, hydrogen peroxide, peroxosulfates such as peroxosulfuric acid and potassium peroxosulfate, periodates such as periodic acid and potassium periodate, bichromate such as potassium bichromate and chromates such as potassium chromate, is used in the form of an aqueous acidic solution.

In some cases, the hardened photoresist layer is not completely stripped and part of the layer remains in matrix holes. When the remaining part of the layer is adhesive to a slurry of a phosphor, three primary color phosphors are mixed with each other when they are applied. This causes a color mixture. The photoresist used in the present invention can be more easily stripped, after it was photochemically hardened, than a prior photoresist containing at least one of polymers containing polyvinyl pyrrolidone or vinyl pyrrolidone and a water-soluble bisazide compound. Therefore, according to the present invention, a phosphor screen of a color picture tube of a black matrix type which is free of the color mixture can be easily prepared.

When polyvinyl alcohol-ammonium dichromate is used as a photoresist, the limit of the diameter of apertures for the passage of beams of a shadow mask capable of forming dots having a size 0.26 mm on the central surface of a panel, said shadow mask having a mask pitch of 0.62 mm, i.e., the limit capable of etching while keeping the size and shape of apertures, is 0.34 mm for the post-etching process and 0.315 mm for the rotary light exposure process.

To the contrary, the present invention using a photoresist having the reciprocity law failure property can form phosphor dots having the same size, i.e., 0.26 mm through a shadow mask having apertures of 0.35 mm in diameter without using the post-etching process whether a rotary light source or a fixed light source is used.

A landing allowance in the rotary light exposure process is smaller than that in the post-etching process. Conditions under which phosphor dots are formed, must be very strictly established.

The present invention has a greater landing allowance than that of the post-etching process. The present invention does not need the post-etching step and can form dots having a desired size by using a shadow mask having large apertures and changing the illuminance of light applied, without producing the "bridging" between the dots. Further, the present invention does not need a rotary light source. Thus, the present invention has eliminated prior defects. The use of a fixed light source makes it possible to form a color picture tube having a greater landing allowance and a higher brightness for a shorter period of time than the use of a rotary light source.

In practising the present invention, attentions should be paid to the following.

The cross-linking reaction should be carried out by applying light to a photoresist in an atmosphere containing oxygen.

Generally, it is well known that when a photopolymerizable composition is polymerized by applying light thereto and when a photochemically hardenable composition is cross-linked by applying light thereto to be insoluble, an oxygen gas prevents the photopolymerizing and photocross-linking.

For example, it is known that for Photoresist KTFR (trade name) made by Eastman Kodak Co., which is insoluble when cross-linked by light, the photosensitivity thereof when light is applied while contacting with air is lowered by about 1/300 as compared with that when light is applied while intercepting air by an image-forming mask. Thus, Photoresist KTFR should be exposed to light by covering it with the image-forming mask or in the presence of an inert gas in order to avoid the influence of an oxygen and prevent the photosensitivity from lowering.

To the contrary, according to the present invention, the exposure of light to a photoresist in the presence of an oxygen is essential to make the photoresist insoluble due to the reciprocity law failure property. That is, prior photoresists should exclude the influence of oxygen whereas the photoresist of the present invention utilizes purposedly the influence of oxygen. When an acrylamidediacetoneacrylamide copolymer is used as a photoresist the presence of an oxygen is essential. This is one of the distinct features of the present invention and cannot be found in prior processes for manufacturing color picture tubes.

The above explanation has referred to the formation of dots having a round shape for convenience' sake. However, it should be noted that dots having other desired shapes such as a rectangular shape and a square shape or stripes may be formed.

EXAMPLE 1

A mixture having COMPOSITION 1 was coated on a face plate by rotating the face plate and dried. A shadow mask (a diameter of aperture: 0.33 mm; a mask pitch: 0.56 mm) was mounted. A light of 280 lux. from the position of a light source for each of three primary colors R, G and B was applied onto the resulting photoresist layer in contact with air under atmospheric pressure for 90 seconds. An extra-high pressure mercury lamp was used as a light source. The light-applied layer was developed for about 2 minutes by spraying water on the layer. Dots of a photochemically hardened resist were thus obtained at the places corresponding to the three primary colors and dried. Black carbon was then coated onto said face plate and dried again. The hardened resist was destroyed by dipping it into a 0.5% solution of sodium hypochlorite in water at 50° C for 3 minutes and the carbon on the dots was stripped by spraying water. A black matrix was thus obtained. The diameter of the resulting holes was 0.33 mm. at the central area.

Thereafter, aluminizing, frit-baking and mounting of an electron gun were effected in a usual manner. A color picture tube of a black matrix type was thus obtained.

As a surface active agent, polyoxyethyleneoctylphenolether sold under the trade name of Emulgen 810 by Kao Atlas K.K. was used.

| COMPOSITION 1 | |
|---|---|
| A 1% solution of an acrylamide (AA)-diacetoneacrylamide (DAA) copolymer (AA/DAA = 1.5/1) in water | 100 g |
| A sodium salt of 4,4'-diazido-stilbene-2,2'-disulfonic acid | 200 mg |
| N-β(aminoethyl)γ-aminopropyl-trimethoxysilane | 10 μl |
| Ethylene glycol | 400 mg |
| Polyoxyethyleneoctylphenolether | 40 mg |

EXAMPLE 2

The same process as described in EXAMPLE 1 was repeated, but the acrylamide-disacetoneacrylamide copolymer in COMPOSITION 1 was replaced by the copolymers having a AA/DAA ratio of 1.75/1, 2/1 and 3/1. Further the conditions under which light was applied was as follows:

| AA/DAA | = 1.75/1 | : 225 lux. | 85 seconds |
|---|---|---|---|
| " | = 2/1 | : 175 lux. | 90 seconds |
| " | = 3/1 | : 125 lux. | 100 seconds |

In these cases, the diameter of the resulting holes was 0.33 mm. at the central area.

For comparison, a color picture tube of a black matrix type was tried to be manufactured in the same manner by using a photoresist of polyvinyl alcohol-ammonium dichromate (referred to as PVA-ADC hereinafter) which is a typical example of prior photoresists. However, the "bridging" occurred between the resulting dots.

EXAMPLE 3

A photoresist having COMPOSITION 2 below was used. The same process as described in EXAMPLE 1 was repeated to prepare a black matrix. The exposure to light was effected for G (green) alone. A extra-high pressure mercury lamp was used, and the intensity of light and the exposure time were varied. The diameter of the resulting holes was determined. The results are reported in FIG. 4. The solid lines in FIG. 4 show the relationship between the exposure time and the intensity of light, i.e., the illuminance such as to impart a certain size to holes of a black matrix, the size being varied as a parameter. In FIG. 4, the value appended to each curve is a size of holes as a parameter. The two dotted lines in FIG. 4 show the similar relationship for a prior photoresist, i.e., a PVA-5 wt % ADC photoresist.

Since both the ordinate and the abscissa of FIG. 4 are graduated in a logarithm scale, the gradient of the curve equals to a reciprocal of $p$ multiplied by minus one, $p$ being a Schwartzschild's constant representing the reciprocity law failure property in relationship (2). The ranges of the exposure time and the illuminance within which the curves are drawn are practically acceptable. P of a prior PVA-ADC photoresist equals to unity within these ranges. This means that the reciprocity law is established. On the other hand, $p$ of the photoresist having COMPOSITION 2 is in the range of 0.10 – 0.70. Thus, it is found that the reciprocity law failure property which is desired by the present invention is certainly realized within the practical ranges of the exposure time and the illuminance, when the photoresist having COMPOSITION 2 is used.

The illuminance of the abscissa in FIG. 4 were the intensity of light from an extra-high pressure mercury lamp measured with a selenium photocell on the surface of a photoresist.

| COMPOSITION 2 | |
|---|---|
| A 1% solution of an acrylamide (AA)-diacetoneacrylamide (DAA) copolymer (AA/DAA = 1.75/1) in water | 100 g |
| A sodium salt of 4,4'-diazido-stilbene-2,2'-disulfonic acid | 200 mg |
| N-β(aminoethyl)γ-aminopropyl-trimethoxysilane | 10 μl |
| Ethylene glycol | 400 mg |
| Polyoxyethyleneoctylphenolether | 40 mg |

EXAMPLE 4

In accordance with the same process as described in EXAMPLE 1, a photoresist having COMPOSITION 2 was exposed to light for 85 seconds on an exposure stand with a fixed light source of an extra-high pressure mercury lamp. The illuminance for each of R, G and B was 225 lux. Thus, a color picture tube of a black matrix type was manufactured. The diameter of the resulting holes at center was 0.33 mm. at the central area.

EXAMPLE 5

The same process as described in EXAMPLE 1 was practiced using a photoresist having COMPOSITION 1. In order to investigate whether there is a dark reaction after the exposure for each of the three primary colors was finished, the photoresist was left as it was for three hours and the subsequent steps were taken. The color picture tube of a black matrix type thus obtained was entirely the same as that obtained in EXAMPLE 1. From this, it is found that a cross-linked area is not expanded by the dark reaction after the light exposure in the photoresist of the present invention.

EXAMPLE 6

The same process as described in EXAMPLE 1 was repeated. A photoresist having COMPOSITION 2 described in EXAMPLE 3 was exposed to a light of 225 lux. for 40 seconds for each of R, G and B. Dots of photochemically hardened photoresist for each of R, G and B were obtained. However, the exposure was effected while bringing the photoresist layer in contact with an atmospheric pressure of a nitrogen gas, i.e. excluding an oxygen atmosphere from the surface of the photoresist layer.

The resulting dots all put out of shape and were not round. That is, the so-called "bridging" phenomenon occurred.

Thus, it has been found that the exposure in the presence of a nitrogen-containing atmosphere excluding an oxygen gas makes it impossible to obtain desired dots for any colors.

For a comparison, the same process was carried out using the same photoresist. That is, the exposure was effected under an atmospheric pressure of air with light of 225 lux. for 85 seconds for each of R, G and B. The "bridging" phenomenon did not occur.

From the above comparison, it has been found that the exposure should be effected while bringing a photoresist layer in contact with an oxygen-containing gas.

EXAMPLE 7

The same process as described in EXAMPLE 1 was carried out using a photoresist having COMPOSITION 2. The exposure was effected with a light of 225 lux. for 50 seconds for each of R, G and B. Thus, a color picture tube of a black matrix type was manufactured. In this EXAMPLE, a shadow mask having a mask pitch of 0.62 mm and a size of apertures of 0.35 mm was used. A size of the resulting holes was 0.26 mm at the central area.

For a comparison, the same process was carried out using PVA-ADC, which is a typical prior photoresist, and using a shadow mask having the same pitch. Thus, a black matrix having the same size of holes (0.26 mm at the central area) was prepared. The maximum size of apertures of the shadow mask used was 0.315 mm. When a shadow mask having a larger size of apertures was used, the "bridging" phenomenon occurred.

From the above comparison, it has been found that when a black matrix capable of having the same size of holes, i.e. the same brightness is to be prepared, the use of the photoresist of the present invention makes it possible to use a shadow mask having a much larger size of apertures. This means that the present invention can have a higher landing allowance than prior arts.

EXAMPLE 8

In accordance with the same process as described in EXAMPLE 1, a photoresist having COMPOSITION 3 was exposed to a light of 225 lux. for 85 seconds for each of R, G and B on an lighthouse using a fixed light source of an extra-high pressure mercury lamp. Thus, desired dots were obtained. The diameter of the resulting holes at the central area was 0.33 mm.

| COMPOSITION 3 | |
|---|---|
| A 1% solution of an acrylamide-diacetoneacrylamide copolymer (AA/DAA = 1.75/1) in water | 100 g |
| A sodium salt of 4,4'-diazido-stilbene-2,2'-disulfonic acid | 200 mg |
| N-β(aminoethyl)γ-aminopropyl-trimethoxysilane | 10 μl |

EXAMPLE 9

In accordance with the same process as described in EXAMPLE 1, a photoresist having COMPOSITION 4 was exposed to a light of 225 lux. for 85 seconds for each of R, G and B on a lighthouse for the exposure using a fixed light source of an extra-high pressure mercury lamp. Thus, desired dots were obtained. The diameter of the resulting holes at the central area was 0.33 mm.

| COMPOSITION 4 | |
|---|---|
| A 1% solution of an acrylamide-diacetoneacrylamide copolymer (AA/DAA = 1.75/1) in water | 100 g |
| A sodium salt of 4,4'-diazido-stilbene-2,2'-disulfonic acid | 200 mg |
| N-β(aminoethyl)γ-aminopropyl-trimethoxysilane | 10 μl |
| Ethylene glycol | 400 mg |

EXAMPLE 10

In accordance with the same process as described in EXAMPLE 1, a photoresist having COMPOSITION 5 was exposed to a light of 225 lux. for 85 seconds for each of R, G and B on a lighthouse for the exposure using a fixed light source of an extra-high pressure mercury lamp. Thus, desired dots were obtained. The diameter of the resulting holes at the central area was 0.33 mm.

| COMPOSITION 5 | |
|---|---|
| A 1% solution of an acrylamide-diacetoneacrylamide copolymer (AA/DAA = 1.75/1) in water | 100 g |
| A sodium salt of 4,4'-diazido-stilbene-2,2'-disulfonic acid | 200 mg |
| N-β(aminoethyl)γ-aminopropyl-trimethoxysilane | 10 μl |
| Polyoxyethyleneoctylphenolether | 40 mg |

EXAMPLE 11

In accordance with the same process as described in EXAMPLE 1, a photoresist having COMPOSITION 2 was exposed to a light of 500 lux. for 20 seconds for each of R, G and B on a lighthouse for the exposure using a light source of an extra-high pressure mercury lamp. A shadow mask of a stripe type was used, the width of the stripes being 0.8 × 0.2 mm and the pitch between the stripes being horizontally 0.7 mm and vertically 3.0 mm. Thus, a color picture tube of a black stripe type was manufactured. The width of the resulting stripes on the screen was 0.16 mm at the central area thereof.

EXAMPLE 12

In accordance with the same process as described in EXAMPLE 1 except using an exposing condition of 200 lux and 90 sec. and using COMPOSITION 6, black matrix color picture tube was produced. The diameter of the resultant holes was 0.31 mm. at the central area.

| COMPOSITION 6 | |
|---|---|
| A 1% aqueous solution of acrylamide-diacetoneacrylamide copolymer (copolymerization ratio AA/DAA = 1.65/1 | 100 g |
| 4,4'-diazidostilbene-2,2'-disulfonic acid | 210 mg |
| N-β(aminoethyl)-γ-aminopropyl-trimethoxysilane | 10 μl |

-continued

| COMPOSITION 6 | |
|---|---|
| Ethylene glycol | 400 mg |

EXAMPLE 13

The same procedure as described in Example 12 was repeated except that the diazide compound was replaced with 250 mg of potassium salt of 4,4'-diazidostilbene-2,2'-disulfonic acid. A diameter of hole of 0.31 mm at the central area was obtained.

EXAMPLE 14

Black matrix color picture tube was produced in accordance with the same process as described in Example 1 except using an exposing condition of 190 lux and 90 sec. and using COMPOSITION 7. The diameter of the resultant holes was 0.31 mm. at the central area.

| COMPOSITION 7 | |
|---|---|
| A 1% aqueous solution of acrylamide-diacetoneacrylamide copolymer (AA/DAA = 1.85/1) | 100 g |
| Ammonium salt of 4,4'-diazidostilbene-2,2'-disulfonic acid | 230 mg |
| N-β(aminoethyl)-γ-aminopropyl-trimethoxysilane | 10 μl |
| Ethylene glycol | 400 mg |
| Polyoxyethyleneoctylpheolether | 40 mg |

As mentioned above, the present invention cannot only form phosphor dots having a size equal to or smaller than that of apertures for the passage of beams of a shadow mask but also it can prepare a phosphor screen of a color picture tube having higher brightness and landing allowance without post-etching due to the use of a photoresist having a reciprocity law failure property, which avoids the "bridging" effect between dots. That is, when dots having the same pitch and size as those of dots obtained by using a prior photoresist are to be obtained by using a photoresist having a reciprocity law failure property, a shadow mask having apertures which are 1.14 times greater in size than those of a shadow mask used for the prior photoresist, can be used. Further, the present invention can form dots of 1.11 or more times greater in size than the prior art when a shadow mask having the same pitch and size is used.

Another advantage of the present invention is that the use of the photoresist having no increase of a cross-linked area due to the dark reaction after the exposure makes it possible to obtain dots having a uniform size.

Only a process for manufacturing a color picture tube of a black matrix type comprising steps of firstly forming a film of a non-transparent, light-absorbing substance, which film has matrix holes, and then filling said holes with a phosphor has been explained hereinbefore for convenience's sake.

However, the present invention is applicable to cases in which process steps are different. For example, the present invention may be practised by suspending a phosphor in a liquid of a photoresist having a reciprocity law failure property, forming phosphor dots in the conventional manner, so that said phosphor dots are smaller in size than apertures for beam of a shadow mask, and filling surroundings of the phosphor dots with a non-transparent, light-absorbing substance such as carbon to obtain a phosphor screen for a color picture tube of a black matrix type, which is provided with phosphor dots which have a size equal to or smaller than that of apertures for the passage of beams of a shadow mask.

Further, the present invention is not only applicable to the manufacture of a color picture tube, but also broadly to electronics, for example, the manufacture of IC and LSI. Still further, the present invention is applicable to printing and other industries.

What is claimed is:

1. A process for forming a pattern, which comprises the steps of:
   a. preparing a photoresist layer consisting essentially of an acrylamide-diacetoneacrylamide copolymer and a water-soluble aromatic bisazide compound on a surface for the pattern, said layer having the reciprocity law failure property,
   b. applying light to said photoresist layer by passing the light through a mask having said pattern to harden the photoresist layer at a surface area substantially equal to or smaller than that of apertures of said mask through which beams pass; said light being applied in the presence of an oxygen-containing gas, and with Schwartzschild's constant $p$ being in the range of greater than 0 and smaller than 0.76, and
   c. developing the light-applied photoresist layer to form the pattern having a surface area substantially equal to or smaller than that of apertures of said mask through which beams pass.

2. The process according to claim 1, wherein said photoresist layer further includes an adhesion promotor.

3. The process according to claim 2, wherein said adhesion promotor is a water-soluble alkoxysilane.

4. The process according to claim 3, wherein said alkoxysilane is at least one selected from the group consisting of vinyl-tris(β-methoxyethoxy)silane, N-β(aminoethyl)-aminopropylmethyl-dimethoxysilane and N-β(aminoethyl)-γ-aminopropyl-trimethoxysilane.

5. The process according to claim 1, wherein said photoresist layer further includes at least one selected from the group consisting of a surface active agent and ethylene glycol.

6. The process according to claim 5, wherein said surface active agent is at least one selected from the group consisting of polyoxyethylenealkylether, polyoxyethylenealkylphenolether, sorbitan fatty acid ester, polyoxyethylene sorbitan fatty acid ester, polyoxyethylene acyl ester and fatty acid monoglyceride surface active agents.

7. The process according to claim 6, wherein said polyoxyethylenealkylether surface active agent is at least one selected from the group consisting of polyoxyethylenelaurylether, polyoxyethylenecetylether, polyoxyethylenestearylether and polyoxyethyleneoctylether.

8. The process according to claim 6, wherein said polyoxyethylenealkylphenolether surface active agent is at least one selected from the group consisting of polyoxyethyleneoctylphenolether and polyoxyethylenenonylphenolether.

9. The process according to claim 1, wherein said water-soluble aromatic bisazide compound is at least one selected from the group consisting of 4,4'-diazidobenzalacetophenone-2-sulfonic acid, 4,4'-diazidostilbene-2,2'-disulfonic acid and their sulfonates, and 4,4′-diazidostilbene-γ-carboxylic acid and its carboxylate.

10. The process according to claim 1, wherein said photoresist layer further includes a water-soluble high molecular material which is compatible with the acrylamide-diacetoneacrylamide copolymer.

11. The process according to claim 10, wherein said water-soluble high molecular material is at least one selected from the group consisting of carboxymethylcellulose, hydroxymethylcellulose, a sodium salt of poly-L-glutamic acid, gelatine polyacrylamide, polyvinyl methylether, polyvinyl alcohol, polyvinyl acetal, polyethylene oxide, an acrylamide-vinyl alcohol copolymer and a maleic acid-vinyl methylether copolymer.

12. The process according to claim 1, wherein said acrylamide-diacetoneacrylamide copolymer has a copolymerization ratio of acrylamide to diacetoneacrylamide ranging from 1.5 to 3.0 on a mol basis of monomers.

13. The process according to claim 1, wherein said photoresist layer has a ratio of the bisazide compound to the acrylamide-diacetoneacrylamide copolymer ranging from 0.02 to 0.50 on a weight basis.

14. The process according to claim 1, wherein a surface on which the pattern is to be formed is an inner surface of a color picture tube of a black matrix type and said pattern has sites and shapes of three primary color phosphors.

15. The process according to claim 1, wherein a surface on which the pattern is to be formed is an inner surface of a color picture tube of a black stripe type and said pattern has sites and shapes of three primary color phosphors.

16. A process for forming a phosphor pattern having a surface area substantially equal to or smaller than that of apertures for the passage of beam of a shadow mask on an inner surface of a face plate of a color picture tube of a black matrix type, which comprises, the steps of:
  a. preparing a photoresist layer consisting essentially of an acrylamide-diacetoneacrylamide copolymer and a water-soluble aromatic bisazide compound on said inner surface, said layer having the reciprocity law failure property,
  b. applying light to said photoresist layer by passing the light through a shadow mask having said pattern to harden said photoresist layer at a surface area substantially equal to or smaller than that of apertures for the passage of beam of the shadow mask; said light being applied in the presence of an oxygen-containing gas and with Schwartzschild's constant $p$ being in the range of greater than 0 and smaller than 0.76,
  c. developing the light-applied photoresist layer to form the pattern having a surface area substantially equal to or smaller than that of apertures for the passage of beam of the shadow mask,
  d. coating said inner surface with a non-transparent, light-absorbing substance,
  e. pouring a chemically digestive agent on the coated inner surface to remove the hardened photoresist layer forming said pattern together with the non-transparent, light-absorbing substance adhered onto said layer, thereby matrix holes being formed, and
  f. filling said matrix holes with desired phosphors, respectively.

17. The process according to claim 16, wherein said photoresist layer further includes an adhesion promotor.

18. The process according to claim 16, wherein said photoresist layer further includes at least one selected from the group consisting of a surface active agent and etylene glycol.

19. The process according to claim 16, wherein said water-soluble aromatic bisazide compound is at least one selected from the group consisting of 4,4′-diazidobenzalacetophenone-2-sulfonic acid, 4,4′-diazidostilbene-2,2′-disulfonic acid and their sulfonates, and 4,4′-diazidostilbene-γ-carboxylic acid and its carboxylate.

20. The process according to claim 16, wherein said photoresist layer further includes a water-soluble high molecular material which is compatible with the acrylamide-diacetoneacrylamide copolymer.

21. The process according to claim 20, wherein said water-soluble high molecular material is at least one selected from the group consisting of carboxymethylcellulose, hydroxymethylcellulose, a sodium salt of poly-L-glutamic acid, gelatine, polyacrylamide, polyvinyl methylether, polyvinyl alcohol, polyvinyl acetal, polyethylene oxide, an acrylamide-vinyl alcohol copolymer and a maleic acid-vinyl methylether copolymer.

22. The process according to claim 16, wherein said non-transparent, light-absorbing substance is carbon.

23. The claim according to claim 16, wherein said acrylamide-diacetoneacrylamide copolymer has a copolymerization ratio of acrylamide to diacetoneacrylamide ranging from 1.5 to 3.0 in a mole basis of monomers.

24. The process according to claim 16, wherein said photoresist layer has a ratio of the bisazide compound to the acrylamide-diacetoneacrylamide copolymer ranging from 0.02 to 0.50 on a weight basis.

25. A process for forming a pattern which comprises the steps of:
  a. preparing a photoresist layer consisting of an acrylamidediacetone acrylamide copolymer, a water-soluble aromatic bisazide compound, an adhesion promotor and a member selected from the group consisting of a surface-active agent and ethylene glycol and a mixture thereof on a surface for the pattern, said layer having the reciprocity law failure property,
  b. applying light to said photoresist layer by passing the light through a mask having said pattern to harden the photoresist layer at a surface area substantially equal to or smaller than that of apertures of said mask through which beams pass; said light being applied in the presence of an oxygen-containing gas, and with Schwartzschild's constant $p$ being in the range of greater than 0 and smaller than 0.76, and
  c. developing the light-applied photoresist layer to form the pattern having a surface area substantially equal to or smaller than that of apertures of said mask through which beams pass.

* * * * *